United States Patent
Latypov et al.

(10) Patent No.: US 9,530,662 B2
(45) Date of Patent: *Dec. 27, 2016

(54) METHODS FOR FABRICATING INTEGRATED CIRCUITS USING DIRECTED SELF-ASSEMBLY INCLUDING A SUBSTANTIALLY PERIODIC ARRAY OF TOPOGRAPHICAL FEATURES THAT INCLUDES ETCH RESISTANT TOPOGRAPHICAL FEATURES FOR TRANSFERABILITY CONTROL

(71) Applicant: GLOBALFOUNDRIES, Inc., Grand Cayman (KY)

(72) Inventors: Azat Latypov, San Jose, CA (US); Tamer Coskun, San Jose, CA (US); Moshe Preil, Sunnyvale, CA (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/630,676

(22) Filed: Feb. 25, 2015

(65) Prior Publication Data
US 2016/0247686 A1  Aug. 25, 2016

(51) Int. Cl.
  *H01L 21/027* (2006.01)
  *H01L 21/308* (2006.01)
(52) U.S. Cl.
  CPC .................. *H01L 21/3086* (2013.01)
(58) Field of Classification Search
  None
  See application file for complete search history.

(56) References Cited

U.S. PATENT DOCUMENTS

| | | |
|---|---|---|
| 7,347,953 B2 | 3/2008 | Black et al. |
| 7,785,937 B2 | 8/2010 | Kim et al. |
| 7,846,502 B2 | 12/2010 | Kim et al. |
| 8,097,175 B2 | 1/2012 | Millward et al. |
| 8,114,301 B2 | 2/2012 | Millward et al. |

(Continued)

OTHER PUBLICATIONS

Latypov et al., "Exploration of the directed self-assembly based nano-fabrication design space using computational simulations," Alternative Lithographic Technologies, Proc. of SPIE vol. 8680 868013-1, 2013.

(Continued)

*Primary Examiner* — Shamim Ahmed
(74) *Attorney, Agent, or Firm* — Lorenz & Kopf, LLP

(57) ABSTRACT

Methods for fabricating integrated circuits are provided. In one example, a method for fabricating an integrated circuit includes forming a substantially periodic array of a plurality of topographical features including a plurality of etch resistant topographical features and at least one graphoepitaxy feature. The plurality of etch resistant topographical features define a plurality of etch resistant confinement wells and the at least one graphoepitaxy feature defines a graphoepitaxy confinement well that has a different size and/or shape than the etch resistant confinement wells. A block copolymer is deposited into the confinement wells. The block copolymer is phase separated into an etchable phase and an etch resistant phase. The etch resistant topographical features direct the etch resistant phase to form an etch resistant plug in each of the etch resistant confinement wells.

20 Claims, 6 Drawing Sheets

(56) References Cited

U.S. PATENT DOCUMENTS

| | | | |
|---|---|---|---|
| 9,305,800 B2* | 4/2016 | Coskun | H01L 21/3086 |
| 2010/0294740 A1 | 11/2010 | Cheng et al. | |
| 2011/0147985 A1 | 6/2011 | Cheng et al. | |
| 2014/0342290 A1* | 11/2014 | Wu | G03F 7/0035 |
| | | | 430/285.1 |
| 2015/0235839 A1* | 8/2015 | Coskun | H01L 21/0274 |
| | | | 438/694 |
| 2016/0027685 A1* | 1/2016 | Civay | H01L 21/76802 |
| | | | 438/674 |
| 2016/0071930 A1* | 3/2016 | Bentley | H01L 29/0676 |
| | | | 257/401 |

OTHER PUBLICATIONS

Wikipedia contributors, "Copolymer", Wikipedia, The Free Encyclopedia, http://en.wikipedia.org/w/index.php?title=Copolymer&oldid=457198836 (accessed Oct. 24, 2012).
U.S. Appl. No. 14/072,149, filed Nov. 5, 2013.
U.S. Appl. No. 14/185,491, filed Feb. 20, 2014.
Subresolution Assist Features (SRAFs), Fundamental Principles of Optical Lithography, Chapter 10.2.4.,pp. 427-429.

* cited by examiner

METHODS FOR FABRICATING INTEGRATED CIRCUITS USING DIRECTED SELF-ASSEMBLY INCLUDING A SUBSTANTIALLY PERIODIC ARRAY OF TOPOGRAPHICAL FEATURES THAT INCLUDES ETCH RESISTANT TOPOGRAPHICAL FEATURES FOR TRANSFERABILITY CONTROL

TECHNICAL FIELD

The technical field relates generally to methods for fabricating integrated circuits, and more particularly relates to methods for fabricating integrated circuits including topographical features for directed self-assembly.

BACKGROUND

Decreasing device size and increasing device density has traditionally been a high priority for the manufacturing of integrated circuits. Optical lithography has been the driving force for device scaling. Conventional optical lithography is limited to about 80 nm pitch for single exposure patterning. Whilst double and other multi-patterning processes can realize smaller pitch, these approaches are expensive and more complex.

Directed self-assembly (DSA), a technique which aligns self-assembling polymeric materials on a lithographically defined guide pattern, is a potential option for extending current optical lithography beyond its pitch and resolution limits. The self-assembling materials, for example, are block copolymers (BCPs) that consist of "A" homopolymer covalently attached to "B" homopolymer, which are coated over a lithographically defined guide pattern on a semiconductor substrate. The lithographically defined guide pattern is a pre-pattern that is encoded with spatial chemical and/or topographical information and serves to direct the self-assembly process and the pattern formed by the self-assembling materials. Subsequently, by annealing the DSA polymers, the A polymer chains and the B polymer chains undergo phase separation to form an A polymer region and a B polymer region that are registered to the guide pattern. Then, by removing either the A polymer region or the B polymer region by wet chemical or plasma-etch techniques, a mask is formed for transferring the nanopattern to the underlying substrate by means of another etching step of the process.

One DSA technique is graphoepitaxy in which self-assembly is directed by topographical features that are formed overlying a semiconductor substrate. This technique is used, for example, to create contact holes or vias that can be subsequently filled with conductive material for forming electrical connections between one or more layers, for example, overlying the semiconductor substrate. In particular, the topographical features are formed overlying the semiconductor substrate to define confinement wells. The confinement wells are filled with a BCP that is subsequently phase separated to form, for example, etchable cylinders or other etchable features that are each formed of either the A polymer region or the B polymer region of the BCP. The etchable cylinders are removed to form openings and define a mask for etch transferring the openings to the underlying layer.

Unfortunately, current techniques for forming DSA patterns can have considerable process variations that reduce the DSA process window (DSAPW) including reducing transferability control of the topographical features for DSA. The DSAPW is defined as the total process variation for creating the DSA patterns including any process variations from lithographically transferring the mask features to a photoresist layer from a photomask to etch transferring the DSA pattern to the underlying layer. In one approach for improving the DSAPW, the lithographic process window is enhanced for transferring the mask features from the photomask to the photoresist layer. In conventional lithography, non-printing lithographic assist features (SRAFs, Subresolution Assist Features) may be arranged on a photomask about a main feature that is intended to be transferred to the photoresist layer. These non-printing lithographic assist features help to improve the process window by reducing the sensitivity to lithographic process variations, such as variations of dose and focus. The size of these non-printing lithographic assist features is relatively small such that they do not print or transfer to the photoresist layer and otherwise produce unintended features in the integrated circuit. Unfortunately, the relatively small size of these non-printing lithographic assist features limits their benefit for improving the lithographic process window.

In another approach for improving the DSAPW, it is desirable to deposit a uniform thickness of the BCP without overfilling the confinement wells between the topographical features to ensure process uniformity. The local density of the confinement wells generally varies across the semiconductor substrate with some areas having a higher density of confinement wells (e.g., relatively more confinement wells per unit area) and other areas having a lower density of confinement wells (e.g., relatively fewer confinement wells per unit area). In the lower density areas, the confinement wells are particularly susceptible to overfilling with the BCP. One solution is to add additional confinement wells to these areas to increase the local density of confinement wells. However, this may be undesirable because the artificially added confinement wells will generally result in additional features in the mask that will be etch transferred to the underlying substrate resulting, for example, in unintended electrical connections between layers of the substrate.

Accordingly, it is desirable to provide methods for fabricating integrated circuits with improved transferability control for directed self-assembly to enhance the DSA process window. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes forming a substantially periodic array of a plurality of topographical features including a plurality of etch resistant topographical features and at least one graphoepitaxy feature that overlie a semiconductor substrate. The plurality of etch resistant topographical features define a plurality of etch resistant confinement wells and at least one graphoepitaxy feature defines a graphoepitaxy confinement well that has a different size and/or shape than the etch resistant confinement wells for producing an etch-transferrable directed self-assembly (DSA) result. A block copolymer is deposited into the etch resistant confinement wells and the graphoepitaxy confinement well. The block copolymer is phase separated into an etchable phase and an etch resistant phase. The etch resistant topographical features direct the etch resistant phase to form an etch resistant plug in each of the etch resistant confinement wells.

In accordance with another exemplary embodiment, a method for fabricating an integrated circuit is provided. The method includes forming a substantially periodic array of topographical features including a plurality of etch resistant topographical features and at least one graphoepitaxy feature that overlie a semiconductor substrate. The plurality of etch resistant topographical features define a plurality of etch resistant confinement wells and the at least one graphoepitaxy feature defines a graphoepitaxy confinement well. The graphoepitaxy confinement well is filled with a first quantity of a block copolymer. The etch resistant confinement wells are filled with a second quantity of the block copolymer. The first quantity of the block copolymer is phase separated into a first etchable phase and a first etch resistant phase. The at least one graphoepitaxy feature directs the first etchable phase to extend longitudinally substantially through the graphoepitaxy confinement well. The second quantity of the block copolymer is phase separated into a second etchable phase and a second etch resistant phase. The etch resistant topographical features direct the second etch resistant phase to obstruct the second etchable phase from extending longitudinally substantially through each of the etch resistant confinement wells.

In accordance with another exemplary embodiment, a method for fabricating an integrated circuit is provided. The method includes forming a plurality of topographical features overlying a semiconductor substrate to define a plurality of confinement wells arranged in a substantially periodic parallel line array. The plurality of topographical features includes at least one graphoepitaxy feature and a plurality of etch resistant topographical features. The plurality of confinement wells includes a graphoepitaxy confinement well that is defined by at least one graphoepitaxy feature and etch resistant confinement wells that are defined by the etch resistant topographical features. One of the etch resistant confinement wells is directly coupled to the graphoepitaxy confinement well so as to define a modified confinement well that has an etch resistant confinement well section and a graphoepitaxy confinement well section. A block copolymer is deposited into the plurality of confinement wells. The block copolymer is phase separated into an etchable phase and an etch resistant phase. The etch resistant topographical features direct the etch resistant phase to form an etch resistant plug in each of the etch resistant confinement wells including in the etch resistant confinement well section and the at least one graphoepitaxy feature directs the etchable phase to extend longitudinally substantially through the graphoepitaxy confinement well including through the graphoepitaxy confinement well section.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
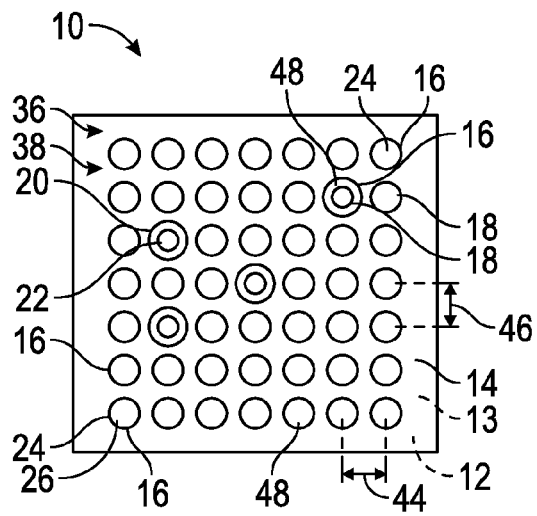
FIG. 1 illustrates, in top view, an integrated circuit during an intermediate fabrication stage in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits. The exemplary embodiments taught herein form a substantially periodic array of topographical features including a plurality of etch resistant topographical features and at least one graphoepitaxy feature that overlie a semiconductor substrate. A substantially periodic array is herein understood to mean an array of substantially the same or similarly shaped and oriented features is called periodic if there is a substantially parallel translation of this array by a predetermined distance and in a predetermined direction, which substantially maps this array onto itself. The etch resistant topographical features define a plurality of etch resistant confinement wells and the at least one graphoepitaxy feature defines a graphoepitaxy confinement well that has a different size and/or shape than the etch resistant confinement wells. A graphoepitaxy feature(s) is herein understood to mean a topographical feature(s) that is sized or otherwise configured to form a confinement well(s) (i.e., the graphoepitaxy confinement well(s)) for directing a block copolymer deposited therein to phase separate during annealing to form an etchable feature that can be etch transferred to the underlying layer. An etch resistant topographical feature(s) is herein understood to mean a topographical feature(s) that is sized or otherwise configured to form a confinement well(s) (i.e., the etch resistant confinement well(s)) for directing a block copolymer deposited therein to phase separate during annealing to prevent, obstruct, or otherwise resist formation of an etchable feature to prevent etch transferring a feature to the underlying layer.

In an exemplary embodiment, the topographical features are formed by lithographically printing the topographical features into a photoresist layer that overlies the semiconductor substrate. It has been found that by lithographically printing (e.g., patterning) the topographical features arranged in the substantially periodic array, the lithographic process window is improved for printing (e.g., patterning) the topographical features into the photoresist layer with only the at least one graphoepitaxy feature resulting in a device feature(s) in the integrated circuit by subsequent DSA processing without any device features resulting from any of the etch resistant topographical features.

A block copolymer is deposited into the confinement wells. In an exemplary embodiment, the graphoepitaxy confinement well is filled with a first quantity of the block copolymer and a second quantity of the block copolymer fills the etch resistant confinement wells. The first and second quantities of the block copolymer may be deposited using the same deposition process, e.g., spin-coating process or the like, or alternatively, may be deposited using separate deposition processes. In an exemplary embodiment, the first and second quantities of the block copolymer are deposited using the same spin-coating process. It has been found that by having the confinement wells arranged in the substantially periodic array, the local density of the confinement wells is consistent throughout the substantially periodic array and, in particular, consistent proximate the graphoepitaxy confinement well to help ensure that the graphoepitaxy confinement well is not overfilled or underfilled with the block copolymer.

The first quantity of the block copolymer is phase separated into a first etchable phase and a first etch resistant phase. In an exemplary embodiment, at least one graphoepitaxy feature directs the first etchable phase to extend longitudinally substantially through the graphoepitaxy confinement well to define an etchable cylinder. The second quantity of the block copolymer is phase separated into a second etchable phase and a second etch resistant phase. In an exemplary embodiment, the etch resistant topographical features direct the second etch resistant phase to obstruct the second etchable phase from extending longitudinally substantially through each of the etch resistant confinement wells by forming an etch resistant plug that extends laterally substantially across each of the etch resistant confinement wells.

In an exemplary embodiment, the phase separated block copolymer is etched to form an etch mask, in particular, by removing the etchable cylinder from the graphoepitaxy confinement well to form a first opening while the etch resistant plugs substantially obstruct etching of the second quantity of the block copolymer to prevent forming any openings through the etch resistant confinement wells. Using the etch mask, the first opening is etch transferred to the underlying layer to form a second opening in the underlying layer. Because openings are not formed through any of the etch resistant confinement wells, any unintended features from the etch resistant confinement wells are not etch transferred from the etch mask to the underlying substrate, thereby helping to prevent forming an unintended electrical connection between layers on the semiconductor substrate.

FIGS. 1-14 illustrate methods for fabricating an integrated circuit 10 in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the manufacture of integrated circuits are well known and so, in the interest of brevity, many conventional steps will only be mentioned briefly herein or will be omitted entirely without providing the well-known process details.

Figure 3:
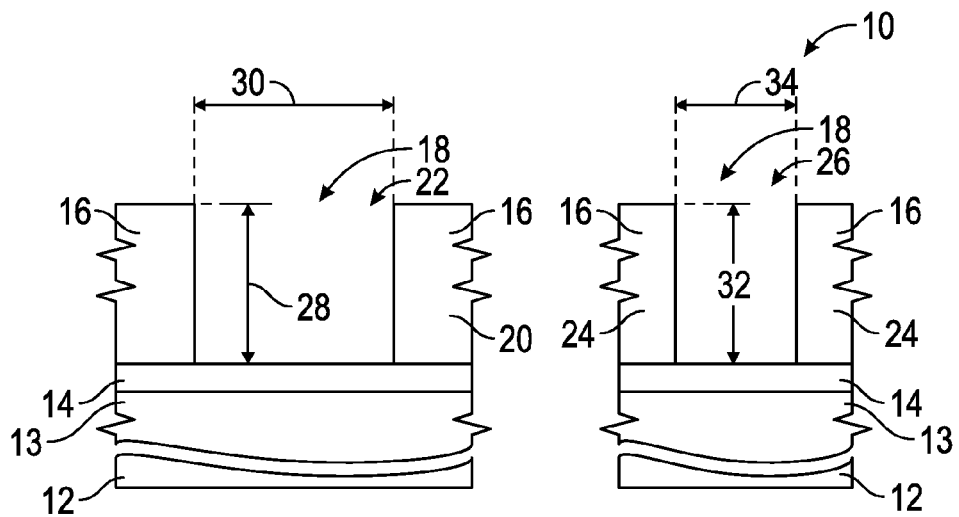
FIG. 3 illustrates, in cross-sectional view, an integrated circuit during an intermediate fabrication stage in accordance with an exemplary embodiment.

FIG. 1 illustrates, in top view, the integrated circuit 10 during an intermediate fabrication stage in accordance with an exemplary embodiment. FIGS. 3-6 illustrate, in cross-sectional views, the integrated circuit 10 including various fabrication stages for forming the integrated circuit 10 depicted in FIG. 1. Referring to FIGS. 1 and 3, the integrated circuit 10 includes a semiconductor substrate 12 that may represent any appropriate carrier material, such as silicon or silicon-based materials, and the like. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

A neutral brush layer 14 overlies an underlying layer 13, which may be an upper portion of the semiconductor substrate 12, or alternatively, any other layer that overlies the semiconductor substrate 12, such as, for example, an interlayer of dielectric material (ILD layer) or the like. In an exemplary embodiment, the neutral brush layer 14 includes a random copolymer that has no preferential affinity for the individual polymeric block components of a block copolymer that will be subsequently deposited over the neutral brush layer 14 as part of a DSA process as will be discussed in further detail below. In one example, the neutral brush layer 14 is formed of a polystyrene-(random)-polymethylmethacrylate (PS-r-PMMA) copolymer brush that produces a neutral surface. In an exemplary embodiment, the neutral brush layer 14 has a thickness of from about 5 to about 10 nm. The neutral brush layer 14 may be formed, for example, by depositing a random copolymer onto the semiconductor substrate 12 using a spin coating process.

As illustrated, topographical features 16 are formed on the neutral brush layer 14 overlying the semiconductor substrate 12 and correspondingly define confinement wells 18. In an exemplary embodiment, the topographical features 16 include graphoepitaxy features 20 that define graphoepitaxy confinement wells 22 and etch resistant topographical features 24 that define an etch resistant confinement well 26. As will be discussed in further detail below, the graphoepitaxy features 20 and the corresponding graphoepitaxy confinement wells 22 are cooperatively configured to direct a block copolymer deposited in the graphoepitaxy confinement wells 22 during phase separation to form an etchable feature (s) that can be etch transferred to the underlying layer 13. Additionally, the etch resistant topographical features 24 and the corresponding etch resistant confinement wells 26 are cooperatively configured to direct a block copolymer deposited in the etch resistant confinement wells 26 during phase separation to prevent, obstruct, or otherwise resist formation of an etchable feature(s) to prevent etch transferring a feature(s) to the underlying layer 13. In an exemplary embodiment, and as will be discussed in further detail below, the graphoepitaxy confinement wells 22 have a depth (indicated by double headed arrow 28) and a width (indicated by double headed arrow 30) that helps direct a block copolymer deposited thereon to phase separate to form an etchable feature(s), e.g., etchable cylinder(s). In an exemplary embodiment, and as will be discussed in further detail below, the etch resistant confinement wells 26 have a depth (indicated by double headed arrow 32) and a width (indicated by double headed arrow 34) that helps direct a block copolymer deposited thereon to phase separate to form an etch resistant feature(s), e.g., etch resistant plug(s).

The topographical features 16 may be formed out of developed photoresist that was exposed using an optical, deep ultraviolet (DUV), or extreme ultraviolet (EUV) lithography tool, or out of developed e-beam resist that was exposed to an electronic beam using an e-beam lithography tool. Other techniques known to those skilled in the art may also be used to form the topographical features 16, such as, for example, maskless EUV or DUV interference lithography, nano-imprint lithography, double DSA lithography, or the like. The methods of interference lithography, nano-imprint lithography, or double DSA lithography are particularly suited and can be used for forming large arrays of periodic features, used in various embodiments described herein for forming, for example, etch resistant confinement wells.

Figure 2:
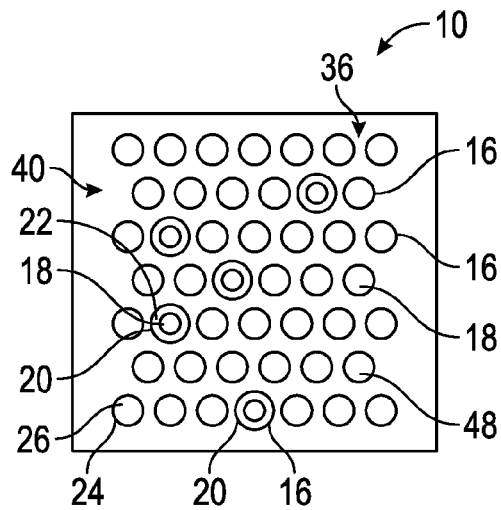
FIG. 2 illustrates, in top view, an integrated circuit during an intermediate fabrication stage in accordance with another exemplary embodiment.
Figure 14:
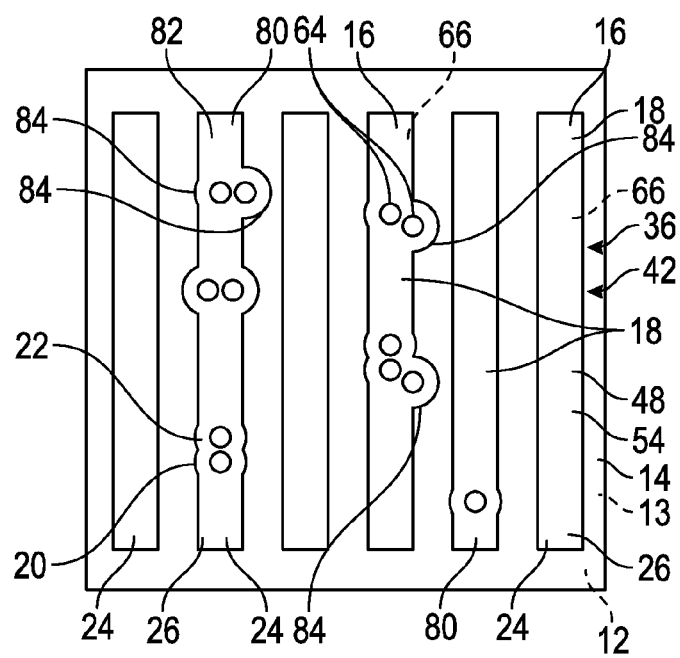
FIG. 14 illustrates, in top view, an integrated circuit during an intermediate fabrication stage in accordance with another exemplary embodiment.

In an exemplary embodiment, the topographical features 16 including the confinement wells 18 are arranged in a substantially periodic array 36. As illustrated in FIG. 1, in an exemplary embodiment, the substantially periodic array 36 is configured as a substantially periodic regular-row-column array 38. In an alternative embodiment and as illustrated in FIG. 2, the substantially periodic array 36 is configured as a substantially periodic hexagonal array 40. In another embodiment and as illustrated in FIG. 14, which is discussed in further detail below, the substantially periodic array 36 is configured as a substantially periodic parallel line array 42. With reference again to FIG. 1, in an exemplary embodiment, the substantially periodic array 36 has periodic pitches 44 and 46 above about 75 nm, respectively, if patterned by currently available optical (e.g., DUV or EUV) lithography tools. In an exemplary embodiment, based on patterning the confinement wells using optical lithography, it has been found that by printing the topographical features 16 that are arranged in the substantially periodic array 36, with its period selected depending on the optical lithography illumination mode, the lithography process window is improved for forming the topographical features 16 overlying the semiconductor substrate 12, compared to the process window of the lithographic process, in which only some of these topographical features, not arranged in a periodic array, are printed. This observation is one manifestation of the well-known problem of a degradation of an optical lithography process window for isolated features, compared to the process window for the same dense (periodic) features, which is usually solved by an introduction of subresolution assist features (see Chapter 10.2.4 of "Subresolution Assist Features (SRAFs)" in Chris Mack, "Fundamental Principles of Optical Lithography. The Science of Microfabrication," Wiley (2008)). Moreover, in an exemplary embodiment, it has been found that by having the confinement wells 18 arranged in the substantially periodic array 36, the local density of the confinement wells 18 is consistent throughout the substantially periodic array 36 and in particular, consistent proximate the graphoepitaxy confinement wells 22 to help ensure that the graphoepitaxy confinement wells 22 are not overfilled or underfilled with a block copolymer as will be discussed in further detail below.

Figure 4:
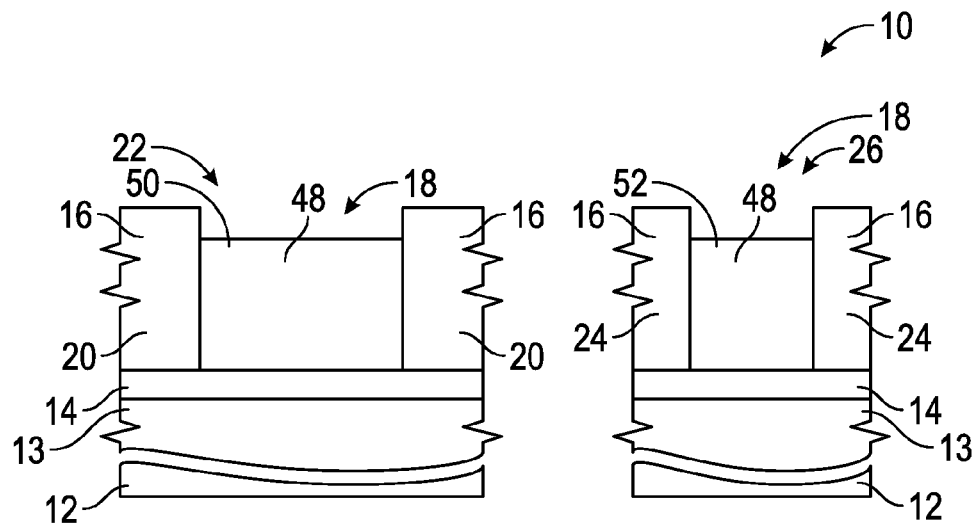
FIG. 4 illustrates, in cross-sectional view, an integrated circuit during a further advanced fabrication stage in accordance with an exemplary embodiment.

Referring to FIGS. 1 and 4, the process continues by depositing a block copolymer 48 into the confinement wells 18. In particular, the graphoepitaxy confinement wells 22 and the etch resistant confinement well 26 are correspondingly filled with quantities 50 and 52 of the block copolymer 48. In an exemplary embodiment, the block copolymer 48 has A polymer blocks and B polymer blocks. Non-limiting examples of block copolymers include polystyrene-block-polymethylmethacrylate (PS-b-PMMA), polystyrene-block-polybutadiene (PS-b-PB), polystyrene-block-poly(2-vinyl pyridine (PS-b-P2VP), polystyrene-block-polydimethylsiloxane (OS-b-PDMS), and polystyrene-block-polyethylene oxide (PS-b-PEO). In an exemplary embodiment, the block copolymer 48 is deposited into the confinement wells 18 using a spin coating process or the like.

Figure 5:
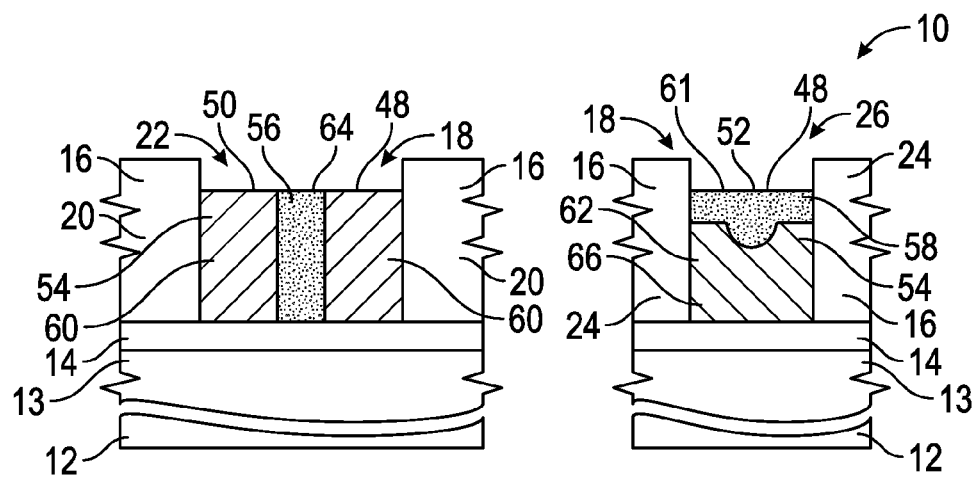
FIG. 5 illustrates, in cross-sectional view, an integrated circuit during a further advanced fabrication stage in accordance with an exemplary embodiment.

Referring to FIGS. 1 and 5, the block copolymer 48 is annealed, for example by either heating the block copolymer 48 at a predetermined temperature for a predetermined time or by applying an organic solvent such as methyl ethyl ketone (MEK), toluene, ethyl acetate, or the like to phase separate the block copolymer 48 and form a phase separated block copolymer 54. In an exemplary embodiment, the block copolymer 48 is heated at a predetermined temperature of from about 125 to about 350° C. for a predetermined time of from 1 minute to about 24 hours to form the phase separated block copolymer 54.

The phase separated block copolymer 54 has etchable phases 56 and 58 and etch resistant phases 60 and 62. Depending upon the particular block copolymer 48, the etchable phases 56 and 58 are formed from either the A polymer blocks or the B polymer blocks of the block copolymer 48 and the etch resistant phases 60 and 62 are formed from the other of the A polymer blocks or the B polymer blocks. In an exemplary embodiment, the block copolymer 48 is PS-b-PMMA and the etchable phases 56 and 58 are PMMA and the etch resistant phases 60 and 62 are PS. In an exemplary embodiment, the etchable phases 56 and 58 are the volume fraction minority phase of the block copolymer 48 (e.g., either the A polymer blocks or the B polymer blocks) and the etch resistant phases 60 and 62 are the volume fraction majority phase of the block copolymer 48 (e.g., the other of the A polymer blocks or the B polymer blocks). Depending on the affinity between the block copolymer phases and the material of the walls of the confinement well(s) or the substrate or underlying layer, the thin "wetting layer" of the minority phase may also form along the walls of the confinement well(s) or the substrate or underlying layer, if the minority phase has a higher affinity to the wall material or the substrate or underlying layer, compared to the majority phase. This thin layer of the minority phase along the wall is usually covered by or substantially intermixed with the etch-resistant materials of the majority phase and the wall and does not affect the etch transfer process of the DSA result.

In an exemplary embodiment and as illustrated on the left side of FIG. 5, the phase separated block copolymer 54 in the graphoepitaxy confinement well 22 is spatially registered to the graphoepitaxy features 20 to define a nanopattern that allows for resolution, for example, in the nanometer range beyond that of conventional optical lithography techniques. In particular and as illustrated, the quantity 50 of the block copolymer 48 in the graphoepitaxy confinement well 22 is phase separated and the graphoepitaxy features 20 direct the etchable phase 56 to extend longitudinally substantially through the graphoepitaxy confinement well 22. In one example, the graphoepitaxy features 20 direct the etchable phase 56 to form an etchable cylinder 64 extending longitudinally substantially through the graphoepitaxy confinement well 22.

In an exemplary embodiment and as illustrated on the right side of FIG. 5, the quantity 52 of the block copolymer 48 in the etch resistant confinement well 26 is phase separated and the etch resistant topographical features 24 direct the etch resistant phase 62 to obstruct the etchable phase 58 from extending longitudinally substantially through the etch resistant confinement well 26. In an exemplary embodiment, the etch resistant topographical features 24 direct the etch resistant phase 62 to form an etch resistant plug 66 underlying a portion 61 of the etchable phase 58 in the etch resistant confinement well 26. In an exemplary embodiment and as illustrated of the right side of FIG. 5, the etch resistant plug 66 may be formed as a solid plug of the etch resistant phase 62 when the block copolymer 48 is phase separated in the etch resistant confinement well 26 that has the depth 32 (see FIG. 1) and/or the width 34 (see FIG. 1), depending upon the particular composition of the block copolymer 48, sized so as to direct such formation. FIG. 5 (right side) thus illustrates the formation of the etch resistant DSA result (that is, bulk copolymer phase separation occurring without forming an etchable cylinder) in the confinement well 26 of sufficiently small width, depending on the particular composition of the block copolymer 48. The width of the confinement well 26 resulting in such etch resistant DSA result can be determined by conducting parametric studies of the DSA in confinement wells covering a certain range of widths, either by means of computational simulations or experimentally.

Figure 6:
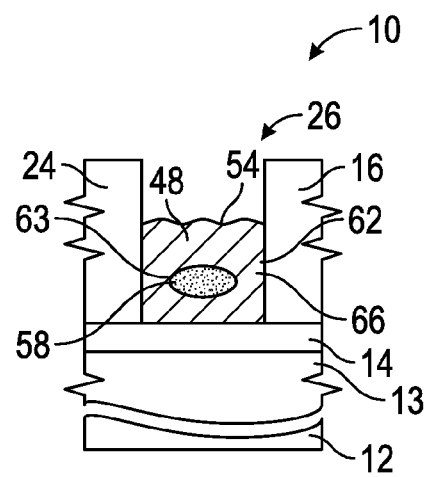
FIG. 6 illustrates, in cross-sectional view, an integrated circuit during a further advanced fabrication stage in accordance with an exemplary embodiment.

In an alternative exemplary embodiment and as illustrated in FIG. 6, the etch resistant plug 66 may be formed as a plug of the etch resistant phase 62 surrounding a portion 63 of the etchable phase 58 when the block copolymer 48 is phase separated in the etch resistant confinement well 26 having the depth 32 (see FIG. 1) and/or the width 34 (see FIG. 1), depending upon the particular composition of the block copolymer 48, sized so as to direct such formation. FIG. 6 thus illustrates the formation of the etch resistant DSA result (that is, bulk copolymer phase separation resulting in an internal cavity 63 of the minority etchable bulk copolymer phase and without forming an etchable cylinder) in the confinement well 26 of sufficiently large width, dependent on the particular composition of the block copolymer 48. It should be noted that the internal minority phase cavity 63 may have a variety of shapes, including, for example, a toroidal (doughnut-like) shape. The range of confinement well widths yielding etch resistant DSA result as shown in FIG. 6 can be determined by conducting parametric studies of the DSA in confinement wells covering a certain range of widths, either by means of computational simulations or experimentally.

Figure 7:
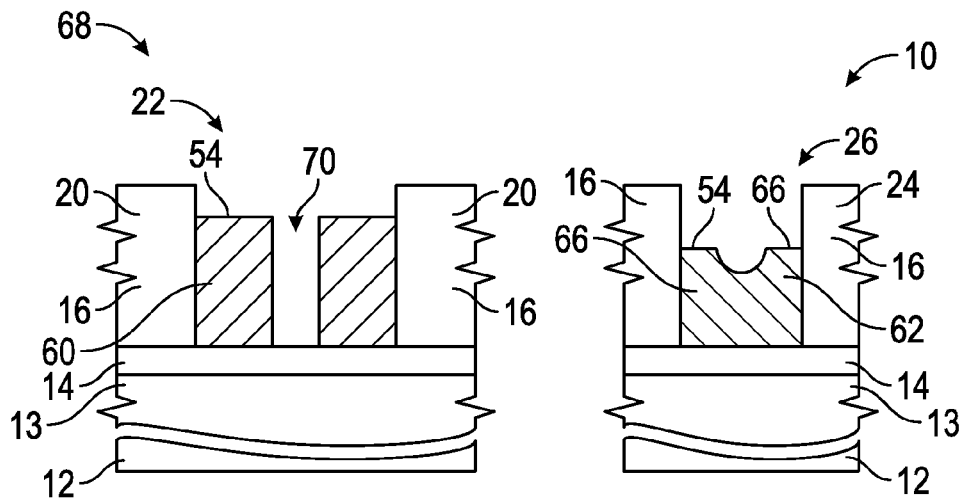
FIG. 7 illustrates, in cross-sectional view, an integrated circuit during a further advanced fabrication stage in accordance with an exemplary embodiment.
Figure 8:
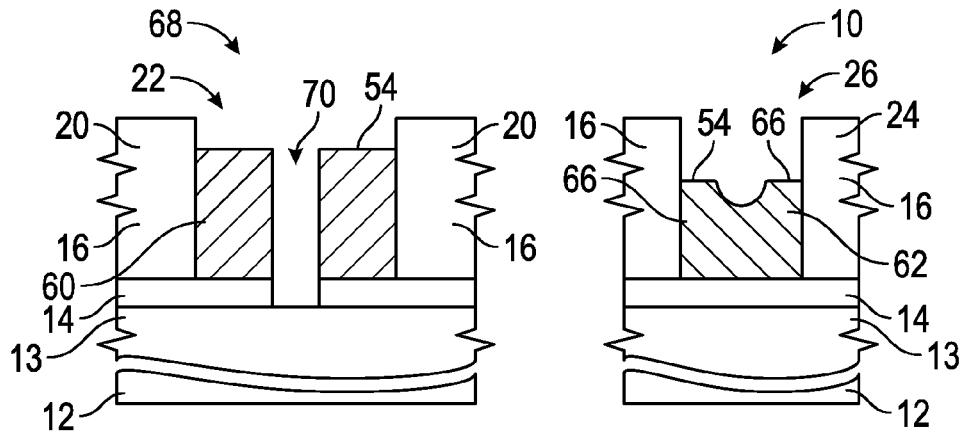
FIG. 8 illustrates, in cross-sectional view, an integrated circuit during a further advanced fabrication stage in accordance with an exemplary embodiment.
Figure 9:
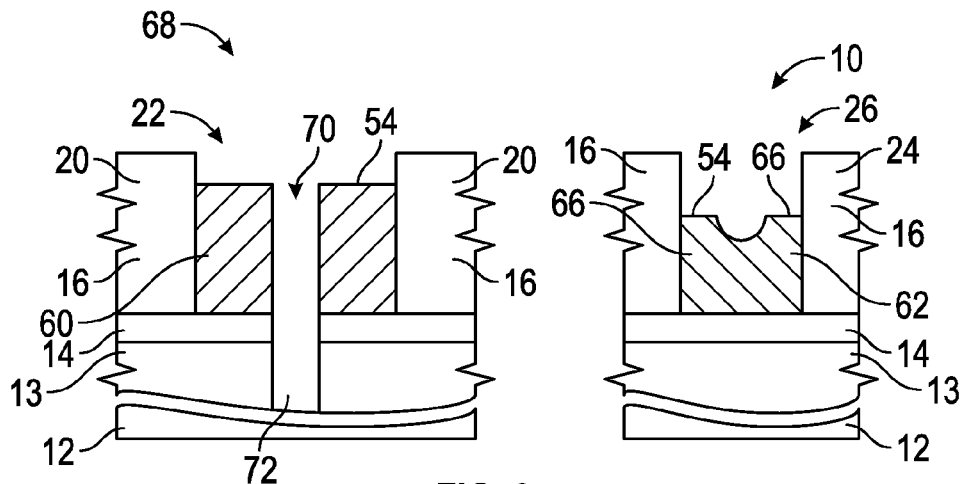
FIG. 9 illustrates, in cross-sectional view, an integrated circuit during a further advanced fabrication stage in accordance with an exemplary embodiment.

The process continues as illustrated in FIG. 7 by etching the phase separated block copolymer 54 to form an etch mask 68. In particular, the phase separated block copolymer 54 is etched to remove the etchable phase 56 (e.g., etchable cylinder 64 shown in FIG. 5) from the graphoepitaxy confinement well 22 while substantially leaving the etch resistant phase 60 to define an opening 70. In the etch resistant confinement well 26, the portion 61 of the etchable phase 58 (shown in FIG. 5) is removed to expose the etch resistant plug 66, which substantially obstructs further etching of the phase separated block copolymer 54. As such, the etch resistant plug 66 prevents formation of a continuous opening through the phase separated block copolymer 54 disposed in the etch resistant confinement well 26. In an exemplary embodiment, the etch mask 68 is formed by exposing the phase separated block copolymer 54 to a dry etching process, such as reactive-ion etching (RIE) plasma, that selectively etches the etchable phases 56 and 58 (shown in FIG. 5) while substantially leaving the etch resistant phases 60 and 62 intact. As illustrated in FIGS. 8-9, using the etch mask 68, the opening 70 is etch transferred through the neutral brush layer 14 into the underlying layer 13 to form an opening 72 without etch transferring any features from the etch resistant confinement well 26 to the underlying layer 13. In an exemplary embodiment, the opening 72 is formed using a conventional wet or dry etching process. Depending on the interaction between the block copolymer phases and the material of the walls of the confinement well(s) or the substrate or underlying layer, the thin "wetting layer" of the minority phase may also form along the walls of the confinement well(s) or the substrate or underlying layer, if the minority phase has a higher affinity to the wall material or the substrate or underlying layer, compared to the majority phase. This thin layer of the minority phase along the wall is usually covered by or substantially intermixed with the etch-resistant materials of the majority phase and the wall and does not affect the etch transfer process of the DSA result.

Figure 10:
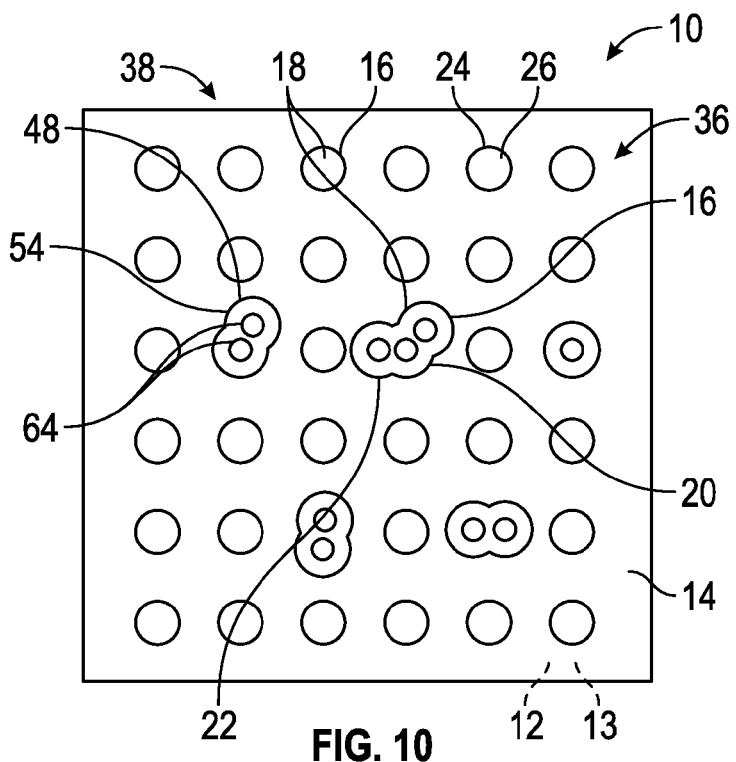
FIG. 10 illustrates, in top view, an integrated circuit during an intermediate fabrication stage in accordance with another exemplary embodiment.
Figure 11:
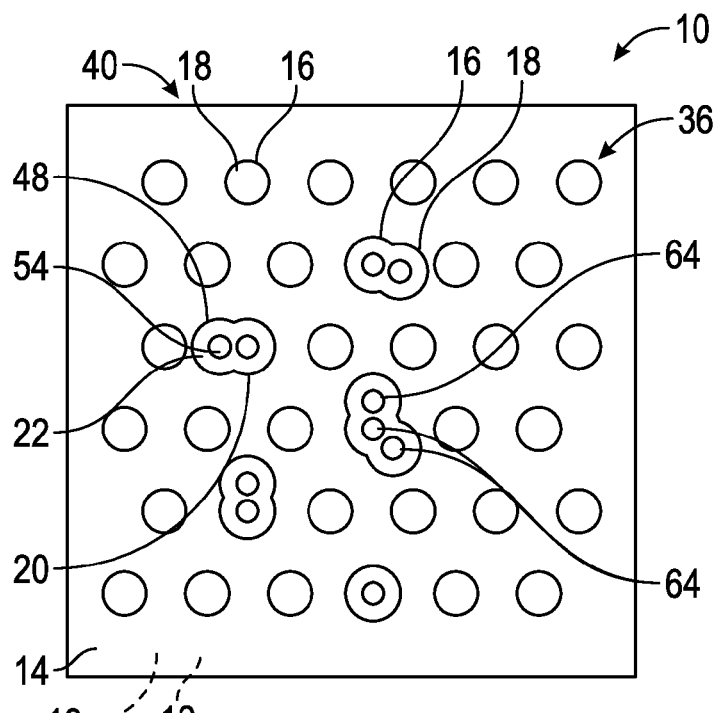
FIG. 11 illustrates, in top view, an integrated circuit during an intermediate fabrication stage in accordance with yet another exemplary embodiment.
Figure 12:
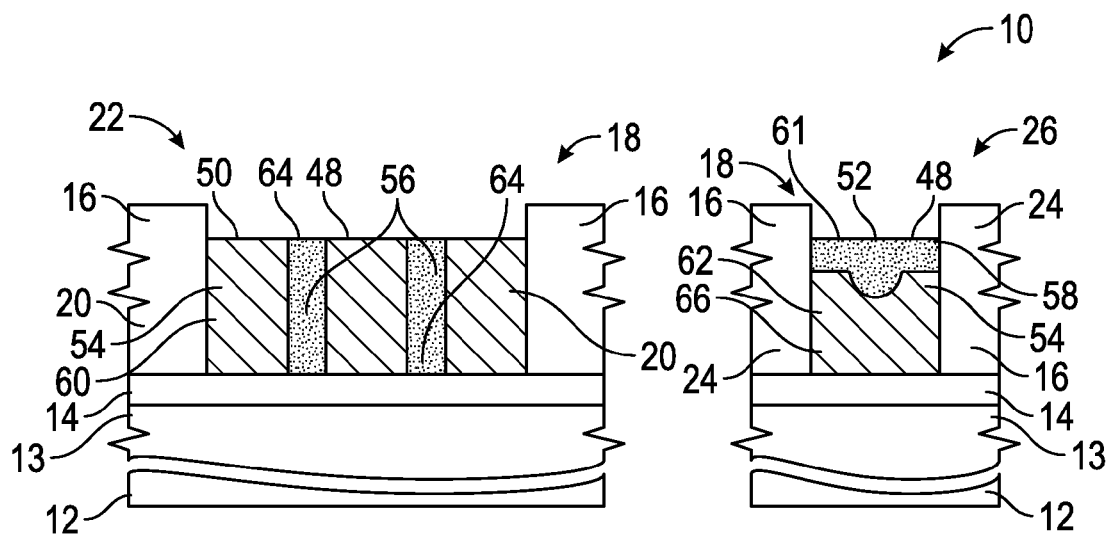
FIG. 12 illustrates, in cross-sectional view, an integrated circuit during a further advanced fabrication stage in accordance with an exemplary embodiment.
Figure 13:
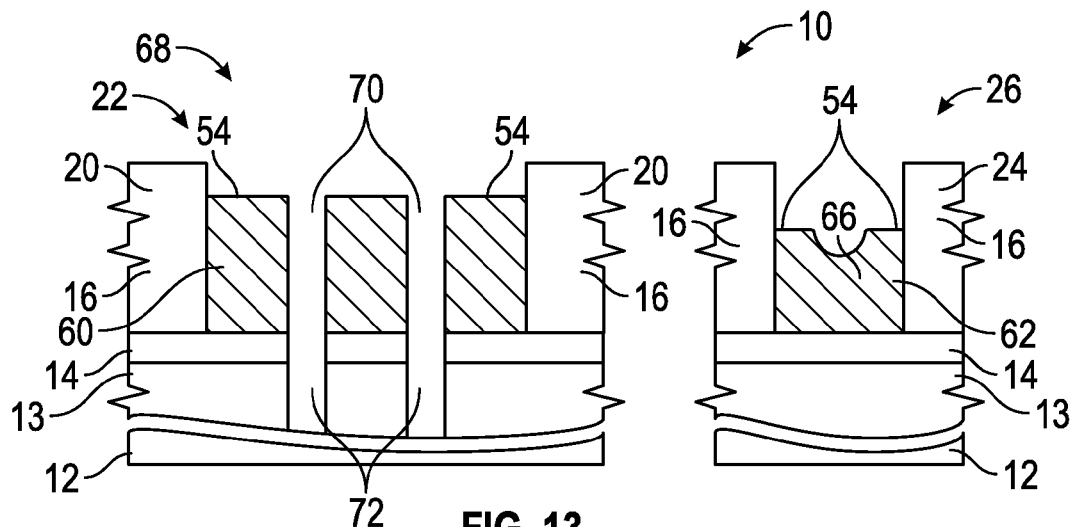
FIG. 13 illustrates, in cross-sectional view, an integrated circuit during a further advanced fabrication stage in accordance with an exemplary embodiment.

FIGS. 10 and 11 illustrate, in top views, the integrated circuit 10 in which the topographical features 16 including the confinement wells 18 are arranged in the substantially periodic regular-row-column array 38 and the substantially periodic hexagonal array 40, respectively, as discussed above in relation to FIGS. 1-9 but at least some of the graphoepitaxy confinement wells 22 are further enlarged and/or elongated so as to form multiple etchable cylinders 64 in the corresponding individual graphoepitaxy confinement wells 22. In particular and also with reference to FIG. 12, at least some of the graphoepitaxy confinement wells 22 each have a depth 28 and a width 30 (see FIG. 3) that helps direct the block copolymer 48 deposited therein to form multiple etchable cylinders 64 during phase separation (see left side of FIG. 12). The process then continues as discussed above in relation to FIGS. 7-9 by removing the multiple etchable cylinders 64 to form an etch mask 68 that is used to form multiple openings 72 into the underlying layer 13 without etch transferring any features from the etch resistant confinement well 26 to the underlying layer 13 as illustrated in FIG. 13.

Referring to FIG. 14, as discussed above, the topographical features 16 including the confinement wells 18 may be arranged in the substantially periodic parallel line array 42. In particular, the etch resistant topographical features 24 define the etch resistant confinement wells 26 configured as a series of parallel trenches. Some of the etch resistant confinement wells 26 are directly coupled to the graphoepitaxy confinement wells 22 that are defined by the graphoepitaxy features 20 to define modified confinement wells 80. The modified confinement wells 80 each have an etch resistant confinement well section(s) 82 that corresponds to the etch resistant confinement well(s) 26 defined by the etch resistant topographical feature(s) 24 and a graphoepitaxy confinement well section(s) 84 that corresponds to the graphoepitaxy confinement well(s) 22 defined by the graphoepitaxy feature(s) 20. As illustrated, the confinement wells 18 contain the block copolymer 48 that is phase separated to form the phase separated block copolymer 54 with the resulting etchable cylinders 64 in the graphoepitaxy confinement well sections 84 and the etch resistant plugs 66 in the etch resistant confinement wells and sections 26 and 82 using various fabrication steps as discussed above in relation to FIGS. 3-6 and 12. The process continues as discussed above in relation to FIGS. 7-9 by removing the etchable cylinders 64 to form an etch mask 68 that is used to form openings 72 into the underlying layer 13 without etch transferring any features from the etch resistant confinement wells and sections 26 and 82 to the underlying layer 13 as illustrated in FIGS. 9 and/or 13.

EXAMPLE

Figure 15:
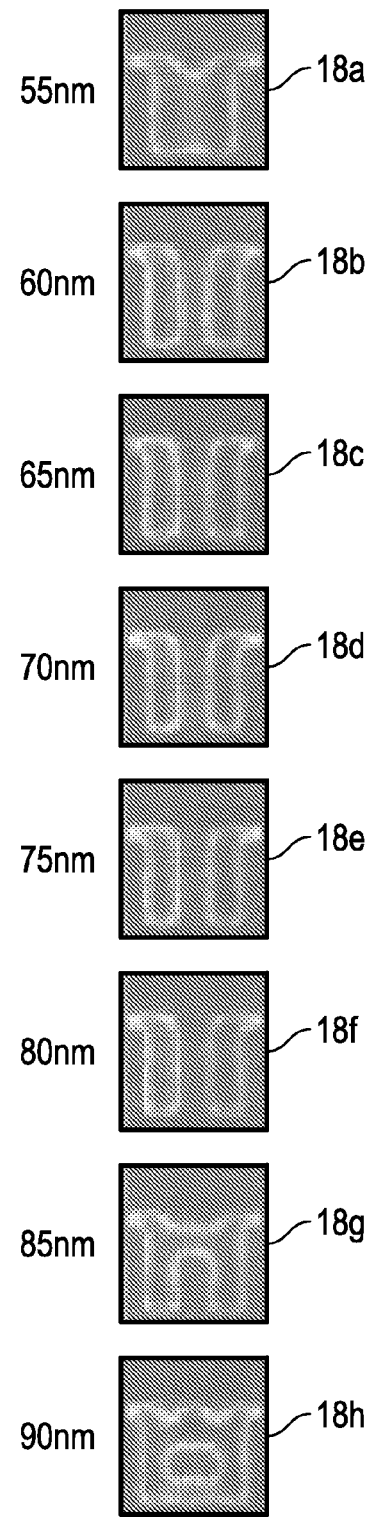
FIG. 15 is an example of computational simulations for determining the dimensions of topographical features and corresponding confinement wells in accordance with an exemplary embodiment.

FIG. 15 is an example of computational simulations for determining the dimensions of topographical features and corresponding confinement wells in accordance with an exemplary embodiment. The example is provided for illustration purposes only and is not meant to limit the various embodiments in any way.

To simulate graphoepitaxy DSA patterns, a masking method referenced in Exploration of the Directed Self-Assembly Based Nano-Fabrication Design Space Using Computational Simulations by Azat Latypov et al., which is incorporated herein in its entirety, is used to model confinement of block copolymers in a three-dimensional simulation domain. The BCP used for the simulation was PS-b-PMMA with a volume fraction of a PS phase of f=0.7, a degree of polymerization of N=663, and an unperturbed radius of gyration of $R_g$=10 nm. The depth of the confinement wells 18*a-h* was set to 50 nm and the widths of the confinement wells 18*a-h* were varied from 55 to 90 nm. As illustrated, the confinement wells 18*b-f* having widths of from 60 nm to 80 nm formed an etchable DSA cylinder of PMMA and the confinement wells 18*a* and 18*g-h* formed etch resistant plugs of PS. As such, in this example, confinement wells having widths of 55 nm or less, or alternatively, widths of 85 to 90 nm were sized to facilitate forming an etch resistant plug, whereas confinement wells having widths of from 60 to 80 nm were sized to facilitate forming an etchable cylinder. It should be noted that similar results can be obtained experimentally by those skilled in the art by forming families of confinement wells with likewise varying widths and/or depths and performing the DSA process with one or more compositions of block copolymer.

Accordingly, methods for fabricating integrated circuits have been described. The exemplary embodiments taught herein form a substantially periodic array of a plurality of topographical features including a plurality of etch resistant topographical features and at least one graphoepitaxy feature. The plurality of etch resistant topographical features define a plurality of etch resistant confinement wells and the at least one graphoepitaxy feature defines a graphoepitaxy confinement well that has a different size and/or shape than the etch resistant confinement wells. A block copolymer is deposited into the confinement wells. The block copolymer is phase separated into an etchable phase and an etch resistant phase. The etch resistant topographical features direct the etch resistant phase to form an etch resistant plug in each of the etch resistant confinement wells.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
    forming a substantially periodic array of a plurality of topographical features comprising a plurality of etch resistant topographical features and at least one graphoepitaxy feature that overlie a semiconductor substrate, wherein the plurality of etch resistant topographical features define a plurality of etch resistant confinement wells and the at least one graphoepitaxy feature defines a graphoepitaxy confinement well that has a different size and/or shape than the etch resistant confinement wells for producing an etch-transferrable directed self-assembly (DSA) result;
    depositing a block copolymer into the etch resistant confinement wells and the graphoepitaxy confinement well; and
    phase separating the block copolymer into an etchable phase and an etch resistant phase, wherein the etch resistant topographical features direct the etch resistant phase to form an etch resistant plug in each of the etch resistant confinement wells with the etch resistant plug extending laterally substantially across at least one of the etch resistant confinement wells.

2. The method of claim 1, wherein forming the substantially periodic array comprises forming the etch resistant confinement wells and the graphoepitaxy confinement well arranged in a substantially periodic parallel line array.

3. The method of claim 1, wherein forming the substantially periodic array comprises forming the etch resistant confinement wells and the graphoepitaxy confinement well arranged in a substantially periodic regular-row-column array.

4. The method of claim 1, wherein forming the substantially periodic array comprises forming the etch resistant confinement wells and the graphoepitaxy confinement well arranged in a substantially periodic hexagonal array.

5. The method of claim 1, wherein forming the substantially periodic array comprises forming the substantially periodic array having a periodic pitch of from about 10 to about 40 nm.

6. The method of claim 1, wherein phase separating comprises forming at least one of the etch resistant plugs extending laterally substantially across at least one of the etch resistant confinement wells.

7. The method of claim 1, wherein phase separating comprises forming at least one of the etch resistant plugs surrounding a corresponding portion of the etchable phase.

8. The method of claim 1, wherein forming the substantially periodic array comprises forming each of the etch resistant confinement wells having a predetermined depth that facilitates directing formation of the etch resistant plugs.

9. The method of claim 8, wherein forming the substantially periodic array comprises forming each of the etch resistant confinement wells having the predetermined depth defined by computational simulations.

10. The method of claim 8, wherein forming the substantially periodic array comprises comprise forming each of the etch resistant confinement wells having the predetermined depth defined experimentally.

11. The method of claim 1, wherein forming the substantially periodic array comprises forming each of the etch resistant confinement wells having a predetermined width that facilitates directing formation of the etch resistant plugs.

12. The method of claim 11, wherein forming the substantially periodic array comprises comprise forming each of the etch resistant confinement wells having the predetermined width defined by computational simulations.

13. The method of claim 11, wherein forming the substantially periodic array comprises forming each of the etch resistant confinement wells having the predetermined width defined experimentally.

14. The method of claim 1, wherein depositing the block copolymer comprises depositing the block copolymer having a volume fraction minority phase and a volume fraction majority phase, and wherein phase separating the block copolymer comprises phase separating the block copolymer into the volume fraction majority phase as the etch resistant phase and the volume fraction minority phase as the etchable phase.

15. A method for fabricating an integrated circuit comprising:
    forming a substantially periodic array of topographical features comprising a plurality of etch resistant topographical features and at least one graphoepitaxy feature that overlie a semiconductor substrate, wherein the plurality of etch resistant topographical features define a plurality of etch resistant confinement wells and the at least one graphoepitaxy feature defines a graphoepitaxy confinement well;
    filling the graphoepitaxy confinement well with a first quantity of a block copolymer;
    filling the etch resistant confinement wells with a second quantity of the block copolymer;
    phase separating the first quantity of the block copolymer into a first etchable phase and a first etch resistant phase, wherein the at least one graphoepitaxy feature directs the first etchable phase to extend longitudinally substantially through the graphoepitaxy confinement well; and
    phase separating the second quantity of the block copolymer into a second etchable phase and a second etch resistant phase, wherein the etch resistant topographical features direct the second etch resistant phase to obstruct the second etchable phase from extending longitudinally substantially through each of the etch resistant confinement wells.

16. The method of claim 15, wherein phase separating the first quantity of the block copolymer comprises directing the first etchable phase to form an etchable cylinder that extends longitudinally substantially through the graphoepitaxy confinement well.

17. The method of claim 15, further comprising:
    depositing a neutral brush layer overlying the semiconductor substrate, wherein forming the substantially periodic array comprises forming the plurality of topographical features overlying the neutral brush layer.

18. The method of claim 15, wherein phase separating the second quantity of the block copolymer comprises directing the second etch resistant phase with the etch resistant topographical features to form an etch resistant plug in each of the etch resistant confinement wells, and wherein the method further comprises:
    etching the block copolymer after phase separating the first and second quantities to remove the first etchable phase from the graphoepitaxy confinement well to form a first opening while obstructing etching of the second quantity of the block copolymer with the etch resistant plugs to prevent forming an opening through any of the etch resistant confinement wells, thereby defining an etch mask.

19. The method of claim 18, further comprising:
    etching a second opening into an underlying layer using the etch mask, wherein the second opening is aligned with the first opening.

20. A method for fabricating an integrated circuit comprising:
    forming a plurality of topographical features overlying a semiconductor substrate to define a plurality of confinement wells arranged in a substantially periodic parallel line array, wherein the plurality of topographical features comprises at least one graphoepitaxy feature and a plurality of etch resistant topographical features, wherein the plurality of confinement wells comprises a graphoepitaxy confinement well that is defined by the at least one graphoepitaxy feature and etch resistant confinement wells that are defined by the etch resistant topographical features, and wherein one of the etch resistant confinement wells is directly coupled to the graphoepitaxy confinement well so as to define a modified confinement well that has an etch resistant confinement well section and a graphoepitaxy confinement well section;
    depositing a block copolymer into the plurality of confinement wells; and
    phase separating the block copolymer into an etchable phase and an etch resistant phase, wherein the etch resistant topographical features direct the etch resistant phase to form an etch resistant plug in each of the etch resistant confinement wells including in the etch resistant confinement well section and the at least one graphoepitaxy feature directs the etchable phase to extend longitudinally substantially through the graphoepitaxy confinement well including through the graphoepitaxy confinement well section.

* * * * *